(12) United States Patent
Chowdhury et al.

(10) Patent No.: US 11,177,645 B2
(45) Date of Patent: Nov. 16, 2021

(54) SYSTEMS AND METHODS FOR IMPROVING RESTRICTED EARTH FAULT PROTECTION

(71) Applicant: Schweitzer Engineering Laboratories, Inc., Pullman, WA (US)

(72) Inventors: Ritwik Chowdhury, Charlotte, NC (US); Matchyaraju Alla, Pullman, WA (US); Vinod K. Yedidi, King of Prussia, PA (US); Jakov Vico, Toronto (CA); Wasif Ahmad, Muscat (OM)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 67 days.

(21) Appl. No.: 16/692,074

(22) Filed: Nov. 22, 2019

(65) Prior Publication Data

US 2021/0159691 A1 May 27, 2021

(51) Int. Cl.
*H02H 3/16* (2006.01)
*H01F 27/40* (2006.01)
*H02H 3/33* (2006.01)

(52) U.S. Cl.
CPC ........... *H02H 3/165* (2013.01); *H01F 27/402* (2013.01); *H02H 3/331* (2013.01)

(58) Field of Classification Search
CPC ......... H02H 3/105; H02H 3/165; H02H 3/331
See application file for complete search history.

(56) References Cited

U.S. PATENT DOCUMENTS

| 4,204,237 | A | | 5/1980 | Zocholl | |
|---|---|---|---|---|---|
| 5,115,226 | A | | 5/1992 | Schweitzer | |
| 5,172,329 | A | * | 12/1992 | Rahman | H02H 7/0455 361/113 |
| 5,367,426 | A | | 11/1994 | Schweitzer, III | |
| 5,508,620 | A | * | 4/1996 | Pfiffner | G01R 27/18 324/510 |
| 5,592,393 | A | * | 1/1997 | Yalla | H02H 7/06 324/522 |

(Continued)

FOREIGN PATENT DOCUMENTS

| GB | 2362275 | | 11/2001 | |
|---|---|---|---|---|
| KR | 1939562 B1 | * | 1/2019 | ............... H02H 3/16 |
| WO | 2005064759 | | 7/2005 | |

*Primary Examiner* — Peter M Novak
(74) *Attorney, Agent, or Firm* — Fletcher Yoder, P.C.

(57) ABSTRACT

A transformer system including a transformer including a set of wye windings, a three-phase current transformer, a neutral-current transformer, and a controller. The three-phase current transformer outputs a first signal indicative of a three-phase current conducting through the set of wye windings and the three-phase current transformer. The neutral-current transformer couples the current flowing from the ground to the neutral node of the transformer, and outputs a second signal indicative of a neutral current conducting from the ground node to the neutral node of the transformer. The controller receives the first signal and the second signal, determines whether an external ground fault condition or an internal ground fault condition is present based on the three-phase current and the neutral current, and determines whether a wiring error is present for the three-phase current transformer or the neutral-current transformer based on the three-phase current and the neutral current.

19 Claims, 4 Drawing Sheets

(56) References Cited

U.S. PATENT DOCUMENTS

| | | | |
|---|---|---|---|
| 5,602,707 A | 2/1997 | Schweitzer | |
| 5,703,745 A | 12/1997 | Roberts | |
| 5,790,356 A * | 8/1998 | Bottrell | H02H 7/04 361/115 |
| 5,963,404 A * | 10/1999 | Guzman-Casillas | H02H 7/045 361/115 |
| 6,011,480 A | 1/2000 | Schweitzer | |
| 6,148,267 A | 11/2000 | Premerlani | |
| 6,256,592 B1 | 7/2001 | Roberts | |
| 6,341,055 B1 | 1/2002 | Guzman-Casillas | |
| 6,356,421 B1 | 3/2002 | Guzman-Casillas | |
| 6,411,865 B1 | 6/2002 | Qin | |
| 6,456,947 B1 | 9/2002 | Adamiak | |
| 6,518,767 B1 | 2/2003 | Roberts | |
| 6,525,543 B1 | 2/2003 | Roberts | |
| 6,573,726 B1 | 6/2003 | Roberts | |
| 6,590,397 B2 | 7/2003 | Roberts | |
| 6,670,721 B2 | 12/2003 | Lof | |
| 6,721,671 B2 | 4/2004 | Roberts | |
| 6,785,105 B2 | 8/2004 | Roberts | |
| 6,841,976 B1 | 1/2005 | Sen | |
| 6,879,917 B2 | 4/2005 | Turner | |
| 7,196,884 B2 | 3/2007 | Guzman-Casillas | |
| 7,279,905 B2 | 10/2007 | Cvorovic | |
| 7,319,576 B2 | 1/2008 | Thompson | |
| 7,345,863 B2 | 3/2008 | Fischer | |
| 7,400,150 B2 | 7/2008 | Cannon | |
| 7,425,778 B2 | 9/2008 | Labuschagne | |
| 7,472,026 B2 | 12/2008 | Premerlani | |
| 7,812,615 B2 | 10/2010 | Gajic | |
| 8,717,725 B2 | 5/2014 | Labuschagne | |
| 2004/0021995 A1 | 2/2004 | Roberts | |
| 2004/0090728 A1* | 5/2004 | Wang | H02H 3/283 361/93.9 |
| 2007/0021937 A1 | 1/2007 | Labuschagne | |
| 2007/0035902 A1 | 2/2007 | Schweitzer | |
| 2007/0070565 A1 | 3/2007 | Benmouyal | |
| 2008/0088466 A1 | 4/2008 | Labuschagne | |
| 2008/0130179 A1 | 6/2008 | Gajic | |
| 2009/0091867 A1 | 4/2009 | Guzman-Casillas | |
| 2011/0241655 A1* | 10/2011 | Shin | G01R 21/1331 324/140 R |
| 2016/0216306 A1* | 7/2016 | Weiher | G01R 31/52 |

* cited by examiner

SYSTEMS AND METHODS FOR IMPROVING RESTRICTED EARTH FAULT PROTECTION

FIELD OF DISCLOSURE

This disclosure relates to the field of transformer and generator protection. More particularly, this disclosure relates to detecting unintended operations in a transformer or low-impedance grounded generator system that uses the Restricted Earth Fault (REF) protection element.

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Electrical equipment, such as transformers, generators, and motors, include standardized ratings for current and power frequency voltage. To ensure that these limitations are not exceeded in order to prevent potential damage caused by unexpected currents and over voltages, protection systems may be utilized.

Some protection schemes use current transformers. Current transformers are used to transform a received current by reducing the values of current. For example, current transformers may scale a supplied current to a suitable value for a secondary system, such as another current transformer and/or a relay. Current transformers may also be used to transform current to a level that may be monitored or measured using standardized equipment. These measurements may subsequently be used to make operation determinations for the transformer or generator being protected. Specifically, protection schemes utilizing current transformers may protect the transformer or generator from internal ground faults. Restricted Earth Fault (REF) protection is one type of protection approach that is often used to protect the transformer or generator. An REF is an earth fault in a restricted or local zone of a circuit (e.g., transformer system circuit), and thus, REF protection includes protection within the restricted zone of the transformer system. However, accurate detection or determination of faults using the REF protection scheme may be dependent on the current transformers of the protection scheme being correctly wired and/or marked.

BRIEF DESCRIPTION

Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

In accordance with one example is a transformer system that includes a transformer including a set of wye windings, a three-phase current transformer, a neutral-current transformer, and a controller. The three-phase current transformer couples to the set of wye windings, in which the three-phase current transformer outputs a first signal indicative of a three-phase current conducting through the set of wye windings and the three-phase current transformer. The neutral-current transformer couples the current flowing through the ground to the neutral node of the transformer, in which the neutral-current transformer outputs a second signal indicative of a neutral current flowing from the ground to the neutral node of the transformer. Additionally, the controller receives the first signal and the second signal, in which the second signal is indicative of a neutral current conducting from a neutral node of the transformer and the neutral-current transformer. Moreover, the controller determines whether an external ground fault condition or an internal ground fault condition is present based on the three-phase current and the neutral current. The controller also determines whether a wiring error is present for the three-phase current transformer or the neutral-current transformer based on the three-phase current and the neutral current. Furthermore, the controller transmits a notification to a computing system based on the external ground fault condition being present, the internal ground fault condition being present, and/or the wiring error being present, in which the notification includes information associated with the external ground fault condition, the internal ground fault condition, and/or the wiring error.

In accordance with another example is a method for detecting an internal ground fault or an external ground fault in a set of wye windings of a transformer of a transformer system. The method including receiving a first signal from a three-phase current transformer, in which the first signal is indicative of a three-phase current conducting between the set of wye windings of the transformer and the three-phase current transformer, and receiving a second signal from a neutral-current transformer, in which the second signal is indicative of a neutral current conducting from a neutral node of the transformer and the neutral-current transformer. The method also includes determining whether an external ground fault condition or an internal ground fault condition is present based on the three-phase current and the neutral current. Moreover, the method includes determining whether a wiring error is present for the three-phase current transformer or the neutral-current transformer based on the three-phase current and the neutral current. Furthermore, the method includes transmitting a notification to a computing system based on the external ground fault condition being present, the internal ground fault condition being present, and/or the wiring error being present, in which the notification includes information associated with the external ground fault condition, the internal ground fault condition, and/or the wiring error.

In accordance with another example is a tangible, non-transitory, computer-readable medium storing instructions executable by one or more processors in a transformer system. The instructions include receiving a first signal from a from a first sensor, in which the first signal is indicative of a three-phase current conducting between the set of wye windings of the transformer and a load, and receiving a second signal from a second sensor, in which the second signal is indicative of a neutral current conducting from a neutral node of the transformer. The instructions also include determining whether an external ground fault condition or an internal ground fault condition is present based on the three-phase current, the neutral current, and a pickup setting, and determining whether a wiring error is present based on the three-phase current transformer, the neutral-current, and the pickup setting. Furthermore, the instructions include transmitting a notification to a computing device in response to the external ground fault condition being present, the internal ground fault condition being present, and/or the wiring error being present.

DRAWINGS

These and other features, aspects, and advantages of the present disclosure will become better understood when the following detailed description is read with reference to the accompanying drawings in which like characters represent like parts throughout the drawings, wherein.

Figure 3:
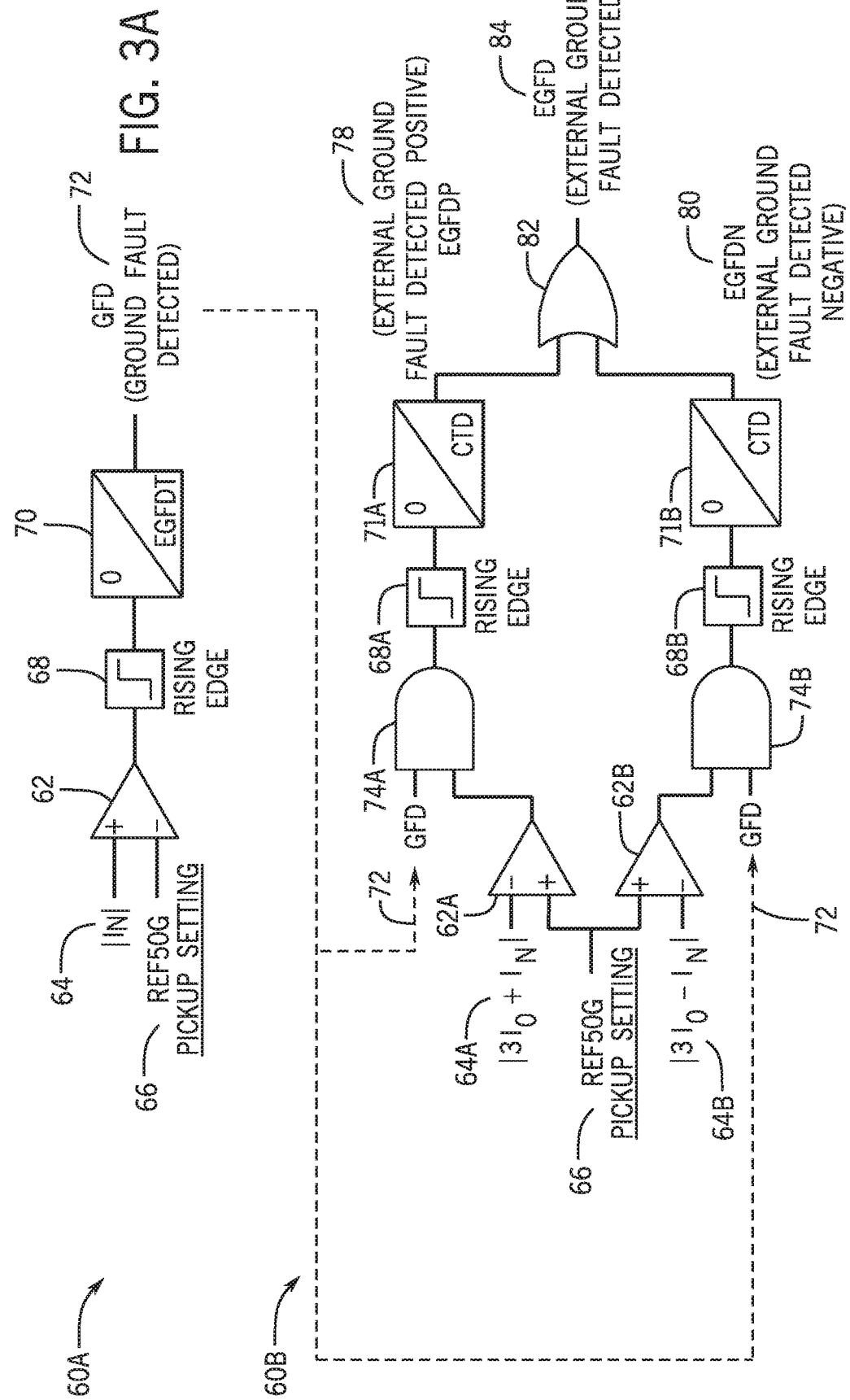
FIG. 3A illustrates a logic diagram of logic used to determine a ground fault in the system, in accordance with an embodiment.
Figure 4:
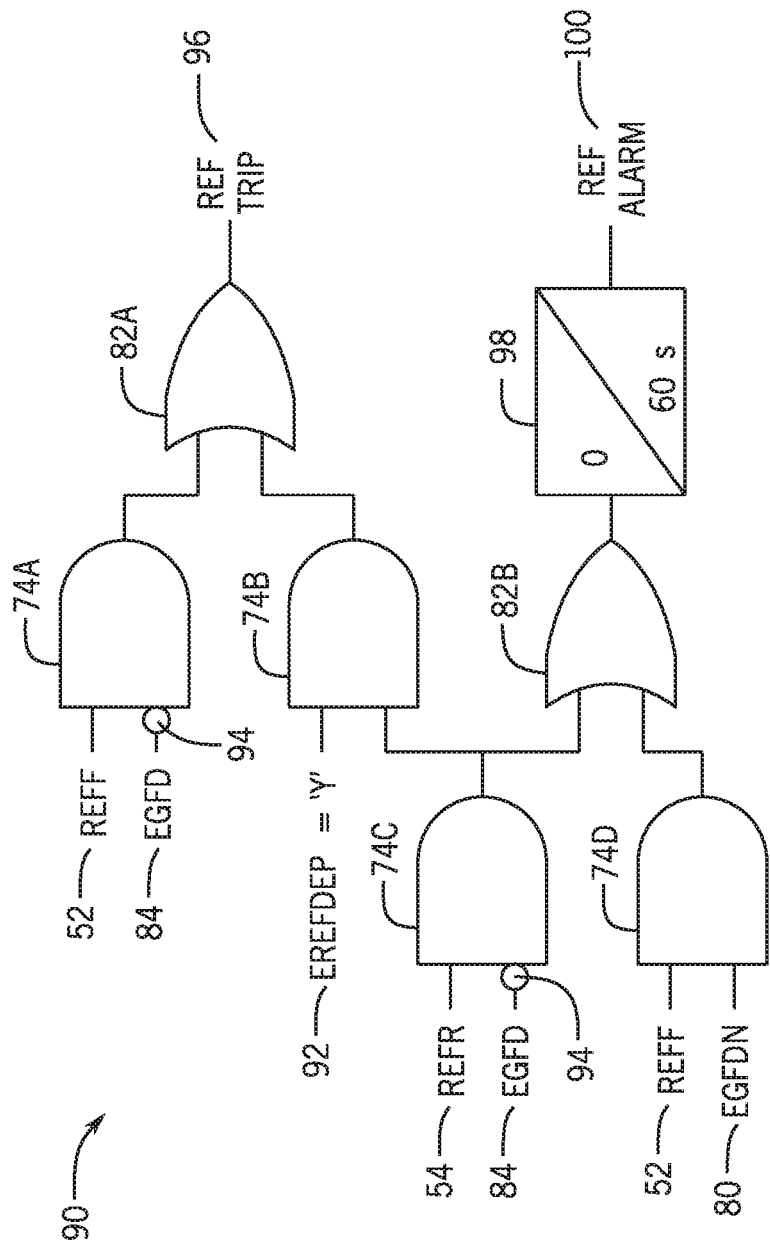

FIG. 3B illustrates a logic diagram of logic used to determine an external ground fault when a neutral-current transformer of the restricted earth fault protection is correct or incorrectly wired, in accordance with an embodiment; and FIG. 4 illustrates a logic diagram of a security sequence logic based on the restricted earth fault protection determinations of FIGS. 3A and 3B, in accordance with an embodiment.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed above, current transformers are transformers used to transform a received current, such as by reducing the values of current, to a value that may be measured by standardized equipment. For example, current transformers along with measuring instruments (e.g., sensors and/or ampere meter) are often used in protection schemes to measure the current flowing through the current transformers as a means for monitoring the transformer being protected in the transformer system.

A variety of protection schemes may be used to mitigate potential damage caused by unintended conditions (e.g., faults) in the transformers and the low impedance grounded generator system. Without the protection schemes, these unintended operations may cause faults that damage the transformer system and/or system components. Overcurrent elements, such as fuses and/or relays with circuit breakers, may be used to protect transformers from high currents, such as a current that is larger than the current transformer's current rating. When a circuit breaker is unavailable or inaccessible, fuses may be used to protect small current transformers (e.g., rating of 1 mega volt amp (MVA) distribution voltage) by breaking an electrical connection of a conductor conducting the high current, thereby interrupting the current and protecting the transformer from potential damage from the high current. When a circuit breaker is available, a relay and a circuit breaker may be used to trip or disconnect the circuit from the current transformer upon detection of the high current. However, these protection mechanisms may not provide adequate protection for transformer windings.

Restricted earth fault (REF) protection may be used for protection against earth faults in the transformer windings. In general, an earth fault includes an unintended fault between a live conductor and the earth (e.g., ground), often occurring due to insulation breakdown. When the fault occurs, short circuit currents may flow through the system and return through the earth or electrical equipment that may cause damage to the overall transformer equipment. In particular, the REF is an earth fault in a restricted or confined zone of a circuit, and thus, REF protection provides protection within the restricted zone of the transformer. The restricted zone may be characterized by a neutral current and current transformer windings.

Figure 1:
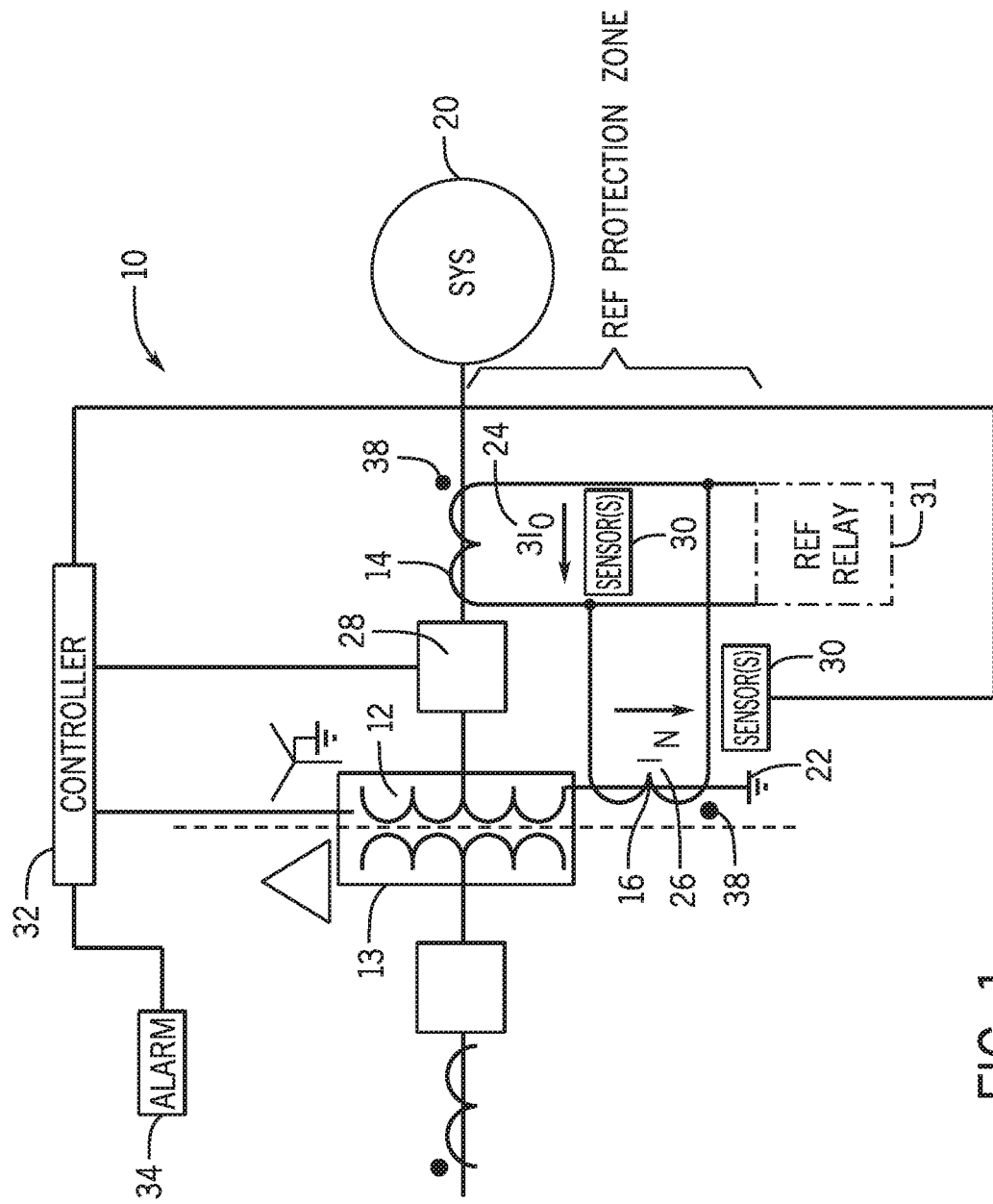
FIG. 1 illustrates a block diagram of a transformer system with restricted earth fault protection, in accordance with an embodiment.

To illustrate, FIG. 1 depicts a block diagram of a transformer system 10 with REF protection that may protect a wye winding 12 (e.g., star winding) of a transformer 13.

In the depicted embodiment, the transformer 13 of the transformer system 10 may provide power to some system 20. As shown, the REF protection in the transformer system 10 in the current embodiment is restricted to a zone between a three-phase current transformer 14 and a neutral-current transformer 16 that are connected to the wye winding 12 of the transformer 13. In particular, the three-phase current transformer 14 and the neutral-current transformer 16 are wired to cancel each other's current during external faults outside the REF protection zone, and drive secondary current to a relay 31 when the fault is inside of the REF protection zone. The three-phase current transformer 14 may include three sets of primary and secondary windings (e.g., three-single phase current transformers) that are each connected to one of the three-phase wye windings (not shown) of the transformer 13. The neutral-current transformer 16 may be connected to the neutral of the transformer 13 and ground 22. As will be described herein, both the three-phase current transformer 14 and the neutral-current transformer 16 may be used to transform currents to and from the wye windings 12 and/or the transformer 13 to a measurable level that may be measured by a measuring device. The measurements may be subsequently used to perform mitigating actions when the detected current level indicates that a fault condition may be present.

Under normal operating conditions, the sum of currents flowing into the conducting network from both the three-phase current transformer 14 and the neutral-current transformer 16 is approximately zero (e.g., a zero-sequence network). That is, the sum of a three-phase current 24 ($3I_0$) from the three-phase current transformer 14 and a neutral current 26 ($I_N$) from the neutral-current transformer 16 is approximately equal to zero. Although not shown, the three-phase current 24 may include the sum of a first current ($I_A$), a second current ($I_B$) and a third current ($I_C$) corresponding to a current conducting via each of the wye windings 12.

If a fault is present in the wye windings 12, the sum of the three-phase current 24 and the neutral current 26 is not zero. For example, if an internal ground fault occurs at circuit breaker 28, then the system 20 may contribute some zero sequence current measured by the three-phase current transformer 14. The zero sequence current measured by the three-phase current transformer 14, however, may not be the same amount of current measured by the neutral-current transformer 16 (e.g., neutral current 26). As such, the sum of the three-phase current 24 and the neutral current 26 is not zero, thereby indicating that a fault condition may be present within the restricted zone.

To measure the three-phase current 24 and the neutral current 26, one or more sensors 30 may be located on the three-phase current transformer 14, on the neutral-current transformer 16, or elsewhere in the transformer system 10. The measured currents may be sent to a controller 32, which may determine whether a fault condition is present and subsequently control the circuit breaker 28, the system 20, and/or an alarm 34 in response to the fault condition being present. For example, upon detection of a fault condition, the controller 32 may send a trip command to the circuit breaker 28 to trip (e.g., switch to open) and disconnect the transformer 13 the system 20 in order to protect the transformer 13 and or the system 20 from damage that may otherwise occur due to the fault. Additionally or alternatively, the controller 32 may send an alarm signal to the alarm 34 to indicate that a fault exists.

Although not shown, the controller 32 may include a microprocessor, a non-volatile memory, and/or a user interface. The microprocessor may include any type of processing circuitry, such as one or more processors, one or more "general-purpose" microprocessors, one or more special-purpose microprocessors, and/or one or more application specific integrated circuits (ASICS), or some combination thereof. For example, the microprocessor may include one or more reduced instruction set (RISC) processors. The processor may process instructions stored in the memory to determine operations and faults, as will be discussed in detail in FIGS. 2-4. Moreover, the processor may process the instructions to command components to actuate (e.g., switch circuit breaker 28 to open or close) based on the determined faults, and so forth.

The memory may be configured to store instructions, data, and/or information, such as an algorithm used for determining internal or external ground faults based on stored data (e.g., predetermined current thresholds) and/or received data (e.g., measured three-phase current 24 and neutral current 26 data via the sensors 30). The memory may be a tangible, non-transitory, computer-readable medium that stores sensor data and/or instructions executable by the processor. Thus, in some embodiments, the memory may include random access memory (RAM), read only memory (ROM), rewritable non-volatile memory, flash memory, hard drives, optical discs, and the like.

Furthermore, in some embodiments, the controller 32 may be communicatively coupled to and/or include a user interface that provides information to and/or receives information from a user (e.g., operator). In some embodiments, the user may control or override the controller 32, such as to manually command a maintenance operation or a mitigating operation (e.g., command circuit breaker 28 to switch to open) to prevent potential damage that may occur in the transformer system 10 due to a fault. The user interface may include any suitable combination of input and output devices, such as an electronic display, a touchscreen, a stylus, a keypad, a button, and/or the like, to enable communicating system fault and/or system information to a user. Moreover, in some embodiments, the controller 32 may be communicatively coupled to and/or include a communication interface that may enable communication with any suitable communication network, such as wiring terminals, a cellular network, a Wi-Fi network, a personal area network (PAN), a local area network (LAN), a wide area network (WAN), and/or the like. For example, the communication interface may enable the controller 32 to communicate with a user interface implemented on a user's mobile device, which may also be communicatively coupled to the communication network.

In some instances, accurately measuring the three-phase current 24 and/or the neutral current 26 may be difficult due to incorrectly wiring the current transformer 16 within the transformer system 10. That is, the three-phase current transformer 14 and the neutral-current transformer 16 may each be wired according to a particular polarity 38. However, if the wiring for the current transformers 14 and 16 are incorrect, then a fault condition or a lack of a fault condition may not be accurately determined.

Figure 2:
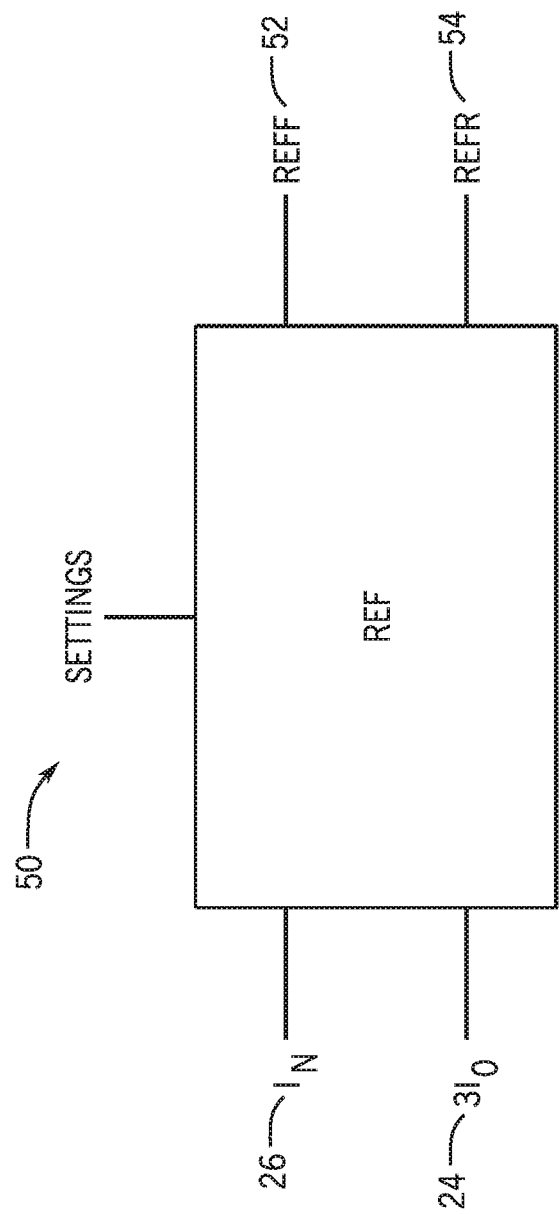
FIG. 2 illustrates a block diagram of a restricted earth fault element used to determine internal and external ground faults, in accordance with an embodiment.

To illustrate, FIG. 2 depicts a block diagram of an REF element 50 used to determine internal and external ground faults. In some embodiments, the REF element 50 may communicate with the controller 32 of FIG. 1 or may be integrated with the controller 32. As shown, the REF element 50 may receive two input values, such as the neutral current 26 ($I_N$) and the three-phase current 24 ($3I_0$), to determine whether an output fault is present. As previously discussed, the sum of these input values may be used to determine where the fault condition is present. For example, the sum may indicate that an internal ground fault 52 (REFF) and/or an external ground fault 54 (REFR) is present.

In some instances, the wiring for the intended polarity 38 or the marking indicating the desired polarity 38 arrangement for the three-phase current transformer 14 and the neutral-current transformer 16 may be incorrectly wired or incorrectly placed, respectively. In such instances, the calculations performed by the REF element 50 may be inaccurate and that may thus result in inaccurate fault detection. For example, the analysis performed by the REF element 50 may determine a type of fault that is present based on the polarity of the results of the performed calculations.

By way of example, if the circuit breaker 28 (of FIG. 1) is closed and the incorrect polarity of the neutral current 26 is provided, such as $-I_N$ instead of a $I_N$, the REF element 50 may incorrectly determine that an external ground fault condition (e.g., condition for REFR 54) is present when an internal ground fault condition (e.g., condition for REFF 52) is present inside the restricted zone. This incorrect determination may occur since the logic to calculate the REFF 52 and REFR 54 may depend on the symmetric properties between the neutral current 26 and the three-phase current 24. Subsequently, the controller 32 may direct operations (e.g., alarms, notifications) to address the incorrectly determined REFR 54. As such, the present embodiments provide improved systems and methods to determine whether a detected fault corresponds to an REFF 52 or an REFR 54.

Briefly, FIG. 3A illustrates a logic diagram of logic 60A that may be used to determine whether a condition for a ground fault signal (GFD) 72 is present when the neutral current ($I_N$) 64 is larger than a pickup setting (REF50G) 66. FIG. 3B illustrates a logic diagram of logic 60B that may be used to accurately determine an external ground fault detected (EGFD) signal 84 (e.g., an REFR 54 determined by the REF element 50 of FIG. 2), regardless of the position of the wiring (e.g., when the neutral current ($I_N$) 26 is incorrectly wired) for the neutral-current transformer 16. In some embodiments, the process and steps of the logic 60A of FIG. 3A and logic 60B of FIG. 3B, may be implemented at least in part by executing instructions stored in a tangible, non-transitory, computer-readable medium, such as the memory of the controller 32, using processing circuitry, such as the microprocessor of the controller 32. Accordingly, the process and steps of the logic 60A and 60B may be performed or controlled by the controller 32.

With the preceding in mind, logic 60A of FIG. 3A depicts a comparator 62 receiving a first input of an absolute neutral current ($|I_N|$) 64 that indicates the magnitude of the measured neutral current 26 at the neutral-current transformer 16 (e.g., via the sensors 30 of FIG. 1) and a second input of a pickup setting 66 that indicates a predetermined current threshold for the neutral current 26 during normal operation. The value of the pickup setting 66 may be set above an expected value for the neutral current 26, or based on a predetermined value that may correspond to current transformer errors or standing system unbalance during normal operation. Using both of these inputs, the comparator 62 may compare the absolute neutral current 64 and the pickup setting 66 to determine if the magnitude of neutral current 64 is greater than the pickup setting 66. If the magnitude of neutral current 64 is greater than the pickup setting 66, then the comparator 62 may output a signal to a signal edge detector 68 to detect a rise from a digital low (e.g., logic 0) to a digital high (e.g., logic 1).

Upon detecting the signal rise (e.g., logic high), the signal edge detector 68 may send the signal output by the comparator 62 to an external ground fault detected time (EGFDT) component 70, which may hold the output of the GFD signal 72 at a logic high for a predetermined period of time. The predetermined period of time may be set by a user, such that the EGFDT component 70 drops out (e.g., opens circuit) after the predetermined period of time expires. The predetermined amount of time set for the EGFDT component 70 may correspond to an amount of time in which the current transformer is expected to remain saturation-free for the worst-case external ground fault. As such, predetermined amount of time set for the EGFDT component 70 may depend on an expected worst-case external ground fault for the transformer 13 on the type of current transformer used. The worst-case external ground fault may allow for the current transformer to remain saturation-free for about quarter of a cycle. During the saturation-free EGFDT period, the logic 60B may calculate the zero-sequence differential current assuming both a wiring error ($3I_0-I_N$) or no wiring error ($3I_0+I_N$).

Referring back to the logic 60A, the predetermined period of time may relate to an amount of time in which the external ground fault may be accurately replicated by the three-phase current transformer 14, as shown in logic 60B of FIG. 3B. As the GFD signal 72 is held for the predetermined period of time, the EGFDT component 70 may send the GFD signal 72 to the controller 32 or other suitable device. This signal may be used (e.g., by an operator or the controller 32 of FIG. 1) to issue commands and operations that may mitigate or prevent damage to the transformer system 10.

On the other hand, if the magnitude of neutral current 64 is below the pickup setting 66, then the comparator 62 may output a signal to the signal edge detector 68 at a digital low (e.g., logic 0). In particular, this condition may indicate that the transformer system 10 is operating normally. Prior to time expiring within the EGFDT component 70 (e.g., saturation free time of the three-phase current transformers), the zero sequence differential current may be calculated using logic 60B of FIG. 3B, which evaluates the zero sequence differential current for incorrectly wired (e.g., $3I_0-I_N$) neutral-current transformer 16 and correctly wired (e.g., $3I_0+I_N$) neutral-current transformer 16.

Turning to FIG. 3B, logic 60B may be used to detect the EGFD signal 84 regardless of the polarity of the neutral current 26. Moreover, although the following discussions describe a zero sequence network and logic for the restricted earth fault protection using the currents provided by the current transformers, which represents a particular embodiment, it should be noted that the method and systems described herein may also be performed and implemented by measuring and using only the magnitude of the currents provided by the current transformers.

As shown, the logic 60B depicts a first comparator 62A and a second comparator 62B. The first comparator 62A may receive a first input of a magnitude sum of the three-phase current and the neutral current 64A ($|3I_0+I_N|$) and compare it to the pickup setting 66. If the magnitude sum of the three-phase current and the neutral current 64A is less than the pickup setting 66, then the first comparator 62A may output a logic high signal to indicate that this condition is present (e.g., logic 1, condition is true) as an input signal to a first AND gate 74A. The first AND gate 74A may also receive a GFD signal 72, which may be output by the EGFDT component 70 described in FIG. 3A above.

If both of these conditions are present, then the first AND gate 74A may output a logic high signal, which may be detected by a first signal edge detector 68A. After receiving the logic high signal, the first signal edge detector 68A may send the signal output by the first AND gate 74A to a first coordination time delay (CTD) component 71A, which may hold a logic high signal for a predetermined period of time similar to the EGFDT component 70 described above. The time period may be predetermined and set based on an expected amount of time for a relay (e.g., relay 31 of FIG. 1) in the transformer system 10 to open and isolate the transformer system 10 from an external ground fault. As the first CTD component 71A holds the logic high signal for the predetermined amount of time, the first CTD component 71A may send an external ground fault detected positive (EGFDP) signal 78 to the controller 32 or other suitable device to indicate that an external ground fault has been detected.

Similarly, the second comparator 62B may receive an input of a magnitude of a difference of the three-phase current and the neutral current 64B ($|3I_0-I_N|$) and compare it to the pickup setting 66. If the magnitude of the three-phase current and the neutral current 64B is less than the pickup setting 66, then the second comparator 62B may output a logic high signal to indicate that this condition is present (e.g., logic 1, condition is true) as an input signal to a second AND gate 74B. The second comparator 62B may also receive the GFD signal 72, which may be output by the EGFDT component 70 described in FIG. 3A above.

If both these conditions are present, then the second AND gate 74B may output a logic high signal, which may be detected by a second signal edge detector 68B. Upon detecting the logic high signal, the second signal edge detector 68B may send the signal output from the second AND gate 74B to an a second coordination time delay (CTD) component 71B, which may determine whether the received signal is a logic high for more than a predetermined period of time. Like the first CTD component 71A, the predetermined period of time may be set based on an expected amount of time for a relay in the transformer system 10 to isolate the transformer system 10 from an REFR 54. In some embodiments, the time period of the first CTD component 71A and the second CTD component 71B may be the same. In other embodiments, the time period may be different.

As the second CTD component 71B holds the logic high for the predetermined amount of time, the second CTD component 71B may send an external ground fault detected negative (EGFDN) signal 80 to the controller 32 or other suitable device to indicate that an external ground fault has been detected but that the current transformers may have been incorrectly wired. This EGFDN signal 80 and the EGFDP signal 78 outputs may be inputs to an OR gate 82, indicating that if at least one of these input conditions are present (e.g., either signal is a logic high), then the EGFD signal 84 is outputted. The EGFD signal 84 may be sent to logic 90 of FIG. 4 to provide alarms and trip signals, as will be described below.

However, if either the magnitude of the sum of the three-phase current and the neutral current 64A or the magnitude of the difference of the three-phase current and the neutral current 64B is not less (e.g., greater) than the pickup setting 66, the EGFD signal 84 may not be sent since the sequence of conditions discussed above are not present. Moreover, if the output signals from either AND gate 74A or 74B is present, then the EGFD signal 84 may be transmitted to the logic 90 of FIG. 4 during the predetermined amount of time that corresponds to the first CTD component 71A or the second CTD component 71B. The presence of the EGFD signal 84 may indicate that there is no fault on the transformer 13 and it is operating normally and that an external ground fault is present.

The EGFD signal 84 may be used to ensure that the relay 31 does not operate and trip the breaker incorrectly. To illustrate, FIG. 4 depicts a logic diagram for a security sequence logic 90 of actions that may be performed in response to detecting REFF 52 or REFR 54 from an existing ground fault detection element in FIG. 2. In some embodiments, the process and steps of the security sequence logic 90 may be implemented at least in part by executing instructions stored in a tangible, non-transitory, computer-readable medium, such as the memory of the controller 32, using processing circuitry, such as the microprocessor of the controller 32. Accordingly, the process and steps of the security sequence logic 90 may be performed or controlled by the controller 32.

As shown, an REFF 52 signal and an inverted (as indicated by inverter 94) EGFD signal 84 may be input to a first AND gate 74A. Thus, when an REFF 52 signal is detected via the REF element 50 and an EGFD signal 84 is not detected via logic 60B, the first AND gate 74A may output a logic high signal (e.g., logic 1). This output signal may be an input to a first OR gate 82A. When these conditions are present, the OR gate 82A may output an REF trip signal 96. This REF trip signal 96 (e.g., via the controller 32) may be sent to the controller 32 to cause the circuit breaker 28 to switch to open, disconnecting the transformer 13 from external components, such as the system 20. In this way, the REF trip signal 96 may be provided when an internal fault is detected within the transformer system 10 and an external ground fault is not detected.

Moreover, a logic high signal from a second AND gate 74B may also result in sending the REF trip signal 96. In particular, the inputs to the second AND gate 74B may include a user configurable dependability setting (EREFDEP) 92 along with an output signal from a third AND gate 74C that allows tripping the breaker correctly for an internal fault even if there is a wiring error. The third AND gate 74C may receive an REFR 54 signal via the REF element 50 and an inverted (as indicated by inverter 94) EGFD signal 84 via logic 60B. When both these conditions are present, the third AND gate 74C may output a logic high signal indicating that an REFR 54 signal is present and the EGFD signal 84 is not present. As previously discussed, the REFR 54 signal may be detected using logic 60A, which assumes correct wiring of the neutral current 26, and the EGFD signal 84 may be detected using logic 60B, which assumes either correct or incorrect wiring of the neutral current 26. As such, the output signal from the third AND gate 74C may indicate that the REFR 54 was incorrectly detected for a transformer wye-winding 12 fault. Thus, the output signal from the third AND gate 74C and the dependable user configurable internal fault setting 92 may also cause the REF trip signal 96 to be transmitted when both conditions are present facilitating clearing the transformer internal ground fault.

Since a wiring error is detected (e.g., indicated by a logic high output signal from the third AND gate 74C), an alarm signal may be issued to alert an operator to resolve the wiring issue. As shown, the output signal from the third AND gate 74C may be an input to a second OR gate 82B, which may then output a logic high signal to a timer component 98. A predetermined time period of the timer component 98 may be related to an amount of time in which the REF alarm signal 100 may be held. That is, in one example, the timer component 98 may output the REF alarm signal 100 for 60 seconds after a wiring error is detected to allow the operator or a downstream supervisory control and data acquisition (SCADA) system (e.g., controller 32) to note that there is a problem with the wiring.

The REF alarm signal 100 may also be transmitted when an REFF 52 is incorrectly detected. As shown, the inputs to the fourth AND gate 74D include an REFF 52 signal and an EGFDN signal 80. When both these conditions are present, the fourth AND gate 74D may output a logic high signal indicating that the REFF 52 is detected and the EGFDN signal 80 is detected. As previously discussed, the REFF 52 signal may be detected using logic 50, which assumes correct wiring of the neutral current 26, and the EGFDN signal 80 may be detected using logic 60B, which assumes incorrect wiring of the neutral current 26. As such, the output signal from the fourth AND gate 74D may indicate that the REFF 52 was incorrectly detected for an REFR 54. Since a wiring error is detected, the REF alarm signal 100 may be sent to alert the operator to resolve the wiring issue.

As shown, the output signal from the fourth AND gate 74D may also be an input to the second OR gate 82B, which may output a logic high signal to the timer component 98 when either of its input conditions are present. If the received signal is present for more than the threshold amount of time, the timer component 98 may output an REF alarm signal 100 from the transformer system 10 to bring attention to the wiring issue. As such, the logic 60A of FIG. 3A and 60B of FIG. 3B may be used in parallel to accurately determine external ground faults, regardless of the polarity for the neutral current 26 due to wiring conditions. Furthermore, the security sequence logic 90 of FIG. 4 may be used to mitigate any potential damage that may otherwise occur due to the faults detected, such as transmitting a trip command and/or an alarm.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present invention should, therefore, be determined only by the following claims.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A transformer system, comprising:
   a transformer comprising a set of wye windings;
   a three-phase current transformer configured to couple to the set of wye windings, wherein the three-phase current transformer is configured to output a first signal indicative of a three-phase current conducting via the set of wye windings and the three-phase current transformer, wherein the three-phase current comprises only a zero-phase sequence phase current associated with each phase of the three-phase current transformer;
   a neutral-current transformer configured to couple to ground and a neutral node of the transformer, wherein the neutral-current transformer is configured to output a second signal indicative of a neutral current conducting from the neutral node of and the neutral-current transformer; and
   a controller configured to:
      receive the first signal and the second signal;
      determine whether an external ground fault condition or an internal ground fault condition is present based on the three-phase current and the neutral current;
      determine whether a wiring error is present for the three-phase current transformer or the neutral-current transformer is present based on the three-phase current and the neutral current, wherein the controller,
      in parallel, determines whether the wiring error is present and whether the external ground fault condition or the internal ground fault condition is present; and
      transmit one or more alarms to a control system based on the external ground fault condition being present, the internal ground fault condition being present, the wiring error being present, or a combination thereof.

2. The transformer system of claim 1, wherein the external ground fault condition, the internal ground fault condition, or a combination thereof, is determined based on a magnitude of the neutral current being greater than a pickup setting.

3. The transformer system of claim 1, wherein the controller is configured to determine whether the wiring error is present based on a magnitude of a sum of the three-phase current and the neutral current being less than a pickup setting.

4. The transformer system of claim 1, wherein the controller is configured to determine whether the wiring error is present by determining that a magnitude of a difference of the three-phase current and the neutral current is less than a pickup setting.

5. The transformer system of claim 4, wherein the controller is configured to determine that the determination of the external ground fault condition while a wiring error is present based on an external ground fault detected negative signal, wherein the external ground fault detected negative signal is based on the magnitude of the difference.

6. The transformer system of claim 1, comprising a first sensor configured to measure the three-phase current and a second sensor configured to measure the neutral current.

7. A method for detecting an internal ground fault or an external ground fault in a set of wye windings of a transformer, the method comprising:
   receiving a first signal from a three-phase current transformer, wherein the first signal is indicative of a three-phase current conducting via the set of wye windings of the transformer and the three-phase current transformer, wherein the three-phase current comprises only a zero-sequence phase current associated with each phase of the three-phase current transformer;
   receiving a second signal from a neutral-current transformer, wherein the second signal is indicative of a neutral current conducting from a neutral node of the transformer and the neutral-current transformer;
   determining whether an external ground fault condition or an internal ground fault condition is present based on the three-phase current and the neutral current;
   determining whether a wiring error is present for the three-phase current transformer or the neutral-current transformer is present based on the three-phase current and the neutral current, wherein determining whether the wiring error is present and whether the external ground fault condition or the internal ground fault condition is present occurs in parallel; and
   transmitting a notification to a computing system based on the external ground fault condition being present, the internal ground fault condition being present, the wiring error being present, or a combination thereof, wherein the notification comprises information associated with the external ground fault condition, the internal ground fault condition, the wiring error, or a combination thereof.

8. The method of claim 7, wherein the external ground fault condition or the internal ground fault condition is determined based on a magnitude of the neutral current being greater than a pickup setting.

9. The method of claim 7, wherein determining whether the wiring error is present is based on a magnitude of a sum of the three-phase current and the neutral current being less than a pickup setting.

10. The method of claim 7, wherein determining whether the wiring error is present by determining that a magnitude of a difference of the three-phase current and the neutral current is less than a pickup setting.

11. The method of claim 7, wherein determining the external ground fault condition comprises determining that a magnitude of the neutral current is greater than a pickup setting and holding a corresponding output signal at a logic high for a predetermined time.

12. The method of claim 11, wherein the predetermined time comprises an amount of time in which a current transformer is expected to stay saturation free.

13. A tangible, non-transitory, computer-readable medium comprising stored instructions executable by one or more processors, wherein the instructions, when executed, are configured to cause the one or more processors to:
   receive a first signal from a first sensor, wherein the first signal is indicative of a three-phase current conducting between a set of wye windings of a transformer and a load, wherein the three-phase current comprises only a zero-sequence phase current associated with a three-phase current transformer coupled to the set of wye windings and a multiplier factor;
   receive a second signal from a second sensor, wherein the second signal is indicative of a neutral current conducting from a neutral node of the transformer;
   determine whether an external ground fault condition or an internal ground fault condition is present based on the three-phase current, the neutral current, and a pickup setting;
   determine whether a wiring error is present based on the three-phase current, the neutral current, and the pickup setting, wherein determining whether the wiring error is present and whether the external ground fault condition or the internal ground fault condition is present occurs in parallel; and
   transmit a notification to a computing device in response to the external ground fault condition being present, the internal ground fault condition being present, the wiring error being present, or a combination thereof.

14. The computer-readable medium of claim 13, wherein the instructions are configured to cause the one or more processors to determine whether the wiring error is present based on a magnitude of sum of the three-phase current and the neutral current being less than pickup setting or a magnitude of a difference of the three-phase current and the neutral current being less than the pickup setting.

15. The computer-readable medium of claim 13, wherein the first sensor comprises a sensor coupled to the three-phase current transformer.

16. The computer-readable medium of claim 13, wherein the instructions are configured to cause the one or more processors to:
   generate a restricted earth fault trip signal in response to detecting an internal ground fault signal indicative of a presence of the internal ground fault condition and an inverted external ground fault detected signal, wherein the inverted external ground fault detected signal is indicative of a correct wiring condition and an external fault condition being present.

17. The computer-readable medium of claim 16, wherein the restricted earth fault trip signal is configured to cause a circuit breaker to disconnect the set of wye windings from a system receiving power from the transformer.

18. The computer-readable medium of claim 13, wherein the second sensor comprises a sensor coupled to a neutral-current transformer.

19. The computer-readable medium of claim 13, wherein the instructions are configured to cause the one or more processors to:
   determine a restricted earth fault alarm signal in response to detecting an external ground fault signal indicative of a presence of the external ground fault condition and an inverted external ground fault detected signal, wherein the inverted external ground fault detected signal corresponds to a correct wiring condition and an external fault condition being present.

* * * * *